(12) United States Patent
Watts et al.

(10) Patent No.: US 6,926,929 B2
(45) Date of Patent: Aug. 9, 2005

(54) SYSTEM AND METHOD FOR DISPENSING LIQUIDS

(75) Inventors: Michael P. C. Watts, Austin, TX (US); Byung-Jin Choi, Austin, TX (US); Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 341 days.

(21) Appl. No.: 10/191,749

(22) Filed: Jul. 9, 2002

(65) Prior Publication Data

US 2004/0010341 A1 Jan. 15, 2004

(51) Int. Cl.⁷ ............................. B05D 1/26; G06F 17/00
(52) U.S. Cl. .......................................... 427/256; 427/96
(58) Field of Search ................. 427/96, 256–288, 427/207.1–208.8, 421–427; 700/239–241; 118/688, 691, 695–697, 707

(56) References Cited

U.S. PATENT DOCUMENTS 3,783,520 A   1/1974   King
4,070,116 A   1/1978   Frosch et al.
4,119,688 A   10/1978  Hiraoka
4,201,800 A   5/1980   Alcorn et al.

(Continued)

FOREIGN PATENT DOCUMENTS

| JP | 55-88332 | 12/1978 |
| JP | 57-7931 | 6/1980 |
| JP | 63-138730 | 12/1986 |
| JP | 02-24848 | 1/1990 |
| JP | 02-92603 | 4/1990 |
| WO | 98/24070 | * 4/1998 |
| WO | WO 00/21689 | 4/2000 |
| WO | WO 01/47003 A2 | 6/2001 |

OTHER PUBLICATIONS

U.S. Appl. No. 10/194,411, Choi et al., filed Jul. 7, 2002.
U.S. Appl. No. 10/194,991, Sreenivasan et al., filed Jul. 7, 2002.

(Continued)

*Primary Examiner*—Fred J. Parker
(74) *Attorney, Agent, or Firm*—Kenneth C. Brooks

(57) ABSTRACT

The present invention provides a method and a system to dispense a liquid, contained in a cartridge, onto a substrate employing a dispensing system under control of a processor in data communication with a memory.

20 Claims, 5 Drawing Sheets

U.S. PATENT DOCUMENTS

| | | |
|---|---|---|
| 4,426,247 A | 1/1984 | Tamamura et al. |
| 4,507,331 A | 3/1985 | Hiraoka |
| 4,552,833 A | 11/1985 | Ito et al. |
| 4,600,309 A | 7/1986 | Fay |
| 4,614,300 A * | 9/1986 | Falcoff |
| 4,657,845 A | 4/1987 | Frechet et al. |
| 4,692,205 A | 9/1987 | Sachdev et al. |
| 4,707,218 A | 11/1987 | Giammarco et al. |
| 4,737,425 A | 4/1988 | Lin et al. |
| 4,808,511 A | 2/1989 | Holmes |
| 4,826,943 A | 5/1989 | Ito et al. |
| 4,848,911 A | 7/1989 | Uchida et al. |
| 4,857,477 A | 8/1989 | Kanamori |
| 4,891,303 A | 1/1990 | Garza et al. |
| 4,908,298 A | 3/1990 | Hefferon et al. |
| 4,919,748 A | 4/1990 | Bredbenner et al. |
| 4,921,778 A | 5/1990 | Thackeray et al. |
| 4,931,351 A | 6/1990 | McColgin et al. |
| 4,964,945 A | 10/1990 | Calhoun |
| 4,976,818 A | 12/1990 | Hashimoto et al. |
| 4,980,316 A | 12/1990 | Huebner |
| 4,999,280 A | 3/1991 | Hiraoka |
| 5,053,318 A | 10/1991 | Gulla et al. |
| 5,071,694 A | 12/1991 | Uekita et al. |
| 5,074,667 A | 12/1991 | Miyatake |
| 5,108,875 A | 4/1992 | Thackeray et al. |
| 5,148,036 A | 9/1992 | Matsugu et al. |
| 5,148,037 A | 9/1992 | Suda et al. |
| 5,151,754 A | 9/1992 | Ishibashi et al. |
| 5,169,494 A | 12/1992 | Hashimoto et al. |
| 5,173,393 A | 12/1992 | Sezi et al. |
| 5,179,863 A | 1/1993 | Uchida et al. |
| 5,198,326 A | 3/1993 | Hashimoto et al. |
| 5,212,147 A | 5/1993 | Sheats |
| 5,234,793 A | 8/1993 | Sebald et al. |
| 5,240,878 A | 8/1993 | Fitzsimmons et al. |
| 5,242,711 A | 9/1993 | DeNatale et al. |
| 5,244,818 A | 9/1993 | Jokerst et al. |
| 5,314,772 A | 5/1994 | Kozicki et al. |
| 5,318,870 A | 6/1994 | Hartney |
| 5,324,683 A | 6/1994 | Fitch et al. |
| 5,328,810 A | 7/1994 | Lowrey et al. |
| 5,330,881 A | 7/1994 | Sidman et al. |
| 5,362,606 A | 11/1994 | Hartney et al. |
| 5,366,851 A | 11/1994 | Novembre |
| 5,374,454 A | 12/1994 | Bickford et al. |
| 5,376,810 A | 12/1994 | Hoenk et al. |
| 5,380,474 A | 1/1995 | Rye et al. |
| 5,417,802 A | 5/1995 | Obeng |
| 5,421,981 A | 6/1995 | Leader et al. |
| 5,422,295 A | 6/1995 | Choi et al. |
| 5,424,549 A | 6/1995 | Feldman |
| 5,431,777 A | 7/1995 | Austin et al. |
| 5,439,766 A | 8/1995 | Day et al. |
| 5,453,157 A | 9/1995 | Jeng |
| 5,458,520 A | 10/1995 | DeMercurio et al. |
| 5,468,542 A | 11/1995 | Crouch |
| 5,507,411 A | 4/1996 | Peckels |
| 5,527,662 A | 6/1996 | Hashimoto et al. |
| 5,654,238 A | 8/1997 | Cronin et al. |
| 5,670,415 A | 9/1997 | Rust |
| 5,700,626 A | 12/1997 | Lee et al. |
| 5,723,176 A | 3/1998 | Keyworth et al. |
| 5,731,981 A | 3/1998 | Simard |
| 5,736,424 A | 4/1998 | Prybyla et al. |
| 5,743,998 A | 4/1998 | Park |
| 5,747,102 A | 5/1998 | Smith et al. |
| 5,855,686 A | 1/1999 | Rust |
| 5,884,292 A | 3/1999 | Baker et al. |
| 5,895,263 A | 4/1999 | Carter et al. |
| 5,907,782 A | 5/1999 | Wu |
| 5,926,690 A | 7/1999 | Toprac et al. |
| 5,948,219 A | 9/1999 | Rohner |
| 5,948,570 A | 9/1999 | Kornblit et al. |
| 5,988,859 A | 11/1999 | Kirk |
| 6,033,977 A | 3/2000 | Gutsche et al. |
| 6,035,805 A | 3/2000 | Rust |
| 6,036,055 A | 3/2000 | Mogadam et al. |
| 6,096,655 A | 8/2000 | Lee et al. |
| 6,150,231 A | 11/2000 | Muller et al. |
| 6,150,680 A | 11/2000 | Eastman et al. |
| 6,234,379 B1 | 5/2001 | Donges |
| 6,245,581 B1 | 6/2001 | Bonser et al. |
| 6,274,294 B1 | 8/2001 | Hines |
| 6,326,627 B1 | 12/2001 | Putvinski et al. |
| 6,329,256 B1 | 12/2001 | Ibok |
| 6,361,831 B1 * | 3/2002 | Sato et al. |
| 6,377,868 B1 * | 4/2002 | Gardner, Jr. |
| 6,383,928 B1 | 5/2002 | Eissa |
| 6,387,783 B1 | 5/2002 | Furukawa et al. |
| 6,388,253 B1 | 5/2002 | Su |
| 6,391,798 B1 | 5/2002 | DeFelice et al. |
| 6,455,411 B1 | 9/2002 | Jiang et al. |
| 6,482,742 B1 | 11/2002 | Chou |
| 6,489,068 B1 | 12/2002 | Kye |
| 6,510,356 B2 | 1/2003 | Seshan |
| 6,514,672 B2 | 2/2003 | Young et al. |
| 6,534,418 B1 | 3/2003 | Plat et al. |
| 6,539,286 B1 | 3/2003 | Jiang |
| 6,541,360 B1 | 4/2003 | Plat et al. |
| 6,561,706 B2 | 5/2003 | Singh et al. |
| 6,565,928 B2 | 5/2003 | Sakamoto et al. |
| 6,588,632 B1 | 7/2003 | Nicol |
| 6,600,969 B2 | 7/2003 | Sudolcan et al. |
| 6,632,742 B2 | 10/2003 | Yang et al. |
| 6,635,581 B2 | 10/2003 | Wong |
| 6,646,662 B1 | 11/2003 | Nebashi et al. |
| 6,676,983 B2 | 1/2004 | Malfait |
| 6,677,252 B2 | 1/2004 | Marsh |
| 6,703,190 B2 | 3/2004 | Elian et al. |
| 6,716,767 B2 | 4/2004 | Shih et al. |
| 6,730,256 B1 | 5/2004 | Bloomstein et al. |
| 6,737,202 B2 | 5/2004 | Gehoski et al. |
| 6,743,713 B2 | 6/2004 | Mukherjee-Roy et al. |
| 6,770,852 B1 | 8/2004 | Steger |
| 6,776,094 B1 | 8/2004 | Whitesides et al. |
| 6,777,170 B1 | 8/2004 | Bloomstein et al. |
| 2002/0094496 A1 | 7/2002 | Choi et al. |
| 2002/0132482 A1 | 9/2002 | Chou |
| 2002/0167117 A1 | 11/2002 | Chou |
| 2003/0080471 A1 | 5/2003 | Chou |
| 2003/0081193 A1 | 5/2003 | White et al. |
| 2003/0129542 A1 | 7/2003 | Shih et al. |
| 2004/0029041 A1 | 2/2004 | Shih et al. |
| 2004/0036201 A1 | 2/2004 | Chou et al. |

OTHER PUBLICATIONS

U.S. Appl. No. 10/194,414, Choi et al., filed Jul. 7, 2002.
U.S. Appl. No. 10/210,785, Watts et al., filed Aug. 1, 2002.
Abstract of Japanese Patent 63–138730.
Abstract of Japanese Patent 55–88332.
Abstract of Japanese Patent 57–7931.
Abstract of Japanese Patent 02–92603.
Translation of Japanese Patent 02–92603.
Abstract of Japanese Patent 02–24848.
Translation of Japanese Patent 02–24848.
Heidari et al., "Nanoimprint Lithography at the 6 in. Wafer Scale," Journal of Vacuum Science Technology, Nov./Dec. 2000, pp. 3557–3560, vol. B, No. 18(6)/.

Nerac.Com Retro Search, "Reduction of Dimension of Contact Holes", Aug. 31, 2004.

Nerac.Com Retro Search, "Trim Etching of Features Formed on an Organic Layer", Sep. 2, 2004.

Nerac.Com Retro Search, "Multi–Layer Resists", Sep. 2, 2004.

Hu et al., "Fluorescence Probe Technicques (FPT) for Measuring the Relative Efficiencies of Free–Radical Photoinitiators", s0024–9297 (97)01390–9; "Macromolecules" 1998, vol. 31, No. 13, pp. 4107–4113, 1998 American Chemical Society. Published on Web May 29, 1998.

Feynman, Richard P., "There's Plenty of Room at the Bottom—An Invitation to Enter a New Field of Physics," 12 pp [online[Retreived Sep. 23, 2004 from URI:http://www.zyvek.com/nanotech/feynman.html.

Communication Relating to the Results of the Partial International Search; International Appl. No. PCT/US2002/015551.

* cited by examiner

SYSTEM AND METHOD FOR DISPENSING LIQUIDS

BACKGROUND OF THE INVENTION

The field of invention relates generally to micro-fabrication of structures. More particularly, the present invention is directed to a system and method for dispensing liquids to facilitate patterning substrates using imprint lithography.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable liquid composition. A mold makes mechanical contact with the polymerizable liquid. The mold includes a relief structure, and the polymerizable liquid composition fills the relief structure. The polymerizable liquid composition is then subjected to conditions to solidify and polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The transfer layer and the solidified polymeric material are subjected to an environment to selectively etch the transfer layer relative to the solidified polymeric material such that a relief image is formed in the transfer layer. The time required and the minimum feature dimension provided by this technique is dependent upon, inter alia, the composition of the polymerizable material.

It is desired, therefore, to provide an improved technique of dispensing liquids to facilitate micro-fabrication.

SUMMARY OF THE INVENTION

The present invention includes a method and system to dispense a liquid, contained in a cartridge, onto a substrate employing a dispensing system under control of a processor in data communication with a memory. The method includes associating an identification code with the cartridge, defining a verifiable identification code. The verifiable identification code includes data concerning characteristics of the liquid, defining verifiable characteristic data. A request is received from a user to activate the dispensing system and permit dispensing of the liquid. To that end, the request includes the verifiable identification code and data concerning the user, defining user data. The verifiable identification code and the user data is compared to a database containing historical information concerning the user. The historical information includes identification codes of cartridges previously associated with the user, defining historical identification codes. The historical identification codes include historical data describing characteristics of liquids contained in the cartridges previously associated with the user. A requested authorization code is generated in response to ascertaining that the historical data matches the verifiable characteristic data. The requested authorization code is transmitted to the user to facilitate activation of the dispensing system in furtherance of dispensing the liquid.

DETAILED DESCRIPTION OF THE PREFERRED EMBODIMENTS

Figure 1:
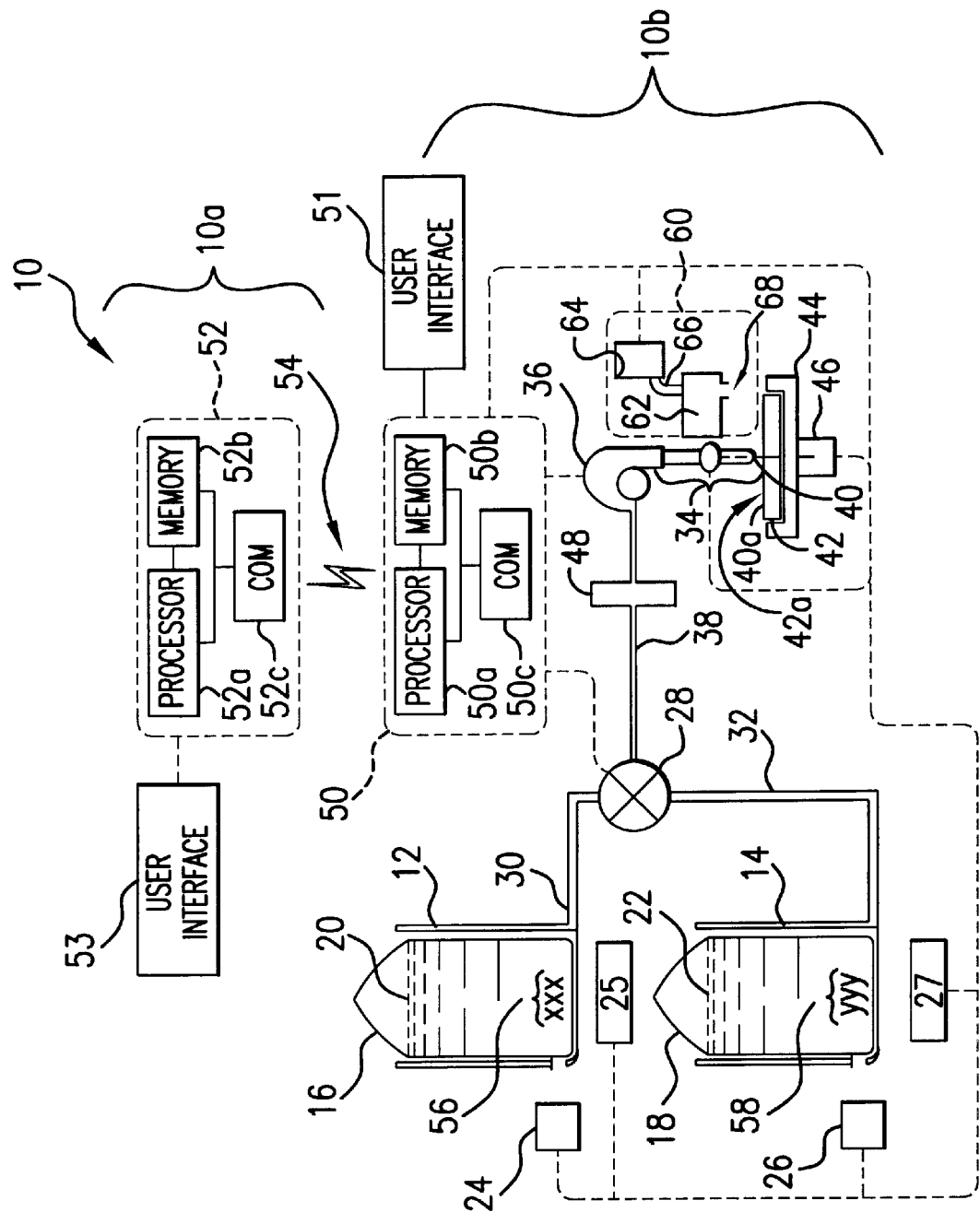
FIG. 1 is a simplified elevation view of a liquid dispensing system in accordance with one embodiment of the present invention.

Referring to FIG. 1, a dispensing system 10 in accordance with one embodiment of the present invention includes two sub-systems 10a and 10b. Sub-system 10b includes a plurality of receptacles 12 and 14, each of which is adapted to receive a cartridge 16 and 18, respectively. Each of cartridges 16 and 18 contains a liquid 20 and 22, respectively. A source of gas pressure (not shown) may be applied to cartridges 16 and 18. In optical communication with liquid 20 and 22 is a detector 24 and 26, respectively, to sense when liquid 20 and 22 has reached a predetermined level. A valve 28 is in fluid communication with cartridges 16 and 18 through conduits 30 and 32, respectively. A nozzle system 34 is in fluid communication with valve 28 via a pump 36 and a conduit 38. Valve 28 operates to selectively place cartridges 16 and 18 in fluid communication with pump 36. In this manner, pump 36 selectively creates a flow of liquid 20 or 22 to propagate through conduit 38 and into nozzle system 34. Liquid 20 or 22 propagating through nozzle system 34 egresses therefrom at tip 40. To that end, tip 40 of nozzle system 34 defines a dispensing axis 40a along which liquid 20 or 22 travels. Disposed opposite to tip 40 in said dispensing axis 40a is a substrate 42. Liquid 20 or 22 exiting tip 40 is deposited on substrate 42. The distance between tip 40 and substrate 42 is selected to avoid splashing of liquids, as well as to prevent gas from being present in liquid disposed thereon. An exemplary nozzle system 34 and pump 36 combination consist of a piezo-electric inkjet system or a micro-solenoid system. These systems are suitable for use with system 10 because they can provide accurate and high-resolution volume control. It is desirable that system 10 dispense, onto substrate 42, liquid drops having a volume of 5 nano-liters or less. The surface energy at tip 40 may be designed for specific liquids to allow formation of drops of desired shapes for dispensing.

To allow any region of surface 42a of substrate 42 to receive liquid, substrate 42 rests atop of a mount 44. Mount 44 is connected to a set of motors 46 to move in two directions perpendicular to dispensing axis 40a and, optionally, along a third direction parallel to dispensing axis 40a. Optionally a filter 48 may be positioned in conduit 38 between valve 28 and pump 36 to remove unwanted gases and particles in a flow traveling therebetween. Filter 48 may be configured to be replaced automatically to facilitate continuous operation of system 10.

Operation of system 10 is controlled by the interaction of the two sub-systems 10a and 10b. To that end, sub-system 10b includes a processing system 50 and sub-system 10a includes a processing system 52. Processing systems 50 and 52 communicate over a communication link 54. Communication link 54 may be any known communication link such as a local area network communication with use of Ethernet protocols, or a public wide area network, such as a public switched telephone network over ASDL telephone lines or large bandwidth trunks, such as T1 or OC3 service. As a result, sub-system 10a may be remotely disposed with respect to sub-system 10b, i.e., processing system 10a may be disposed in an area that is different from the area in which sub-system 10b is disposed, e.g., a different room, a different building, a different country and the like.

Processing system 50 controls the operations of system 10 and processing system 52 provides authorization to processing system 50 to commence dispensing of liquid 20 or 22. To that end, processing system 50 is in data communication with detectors 24 and 26, valve 28, pump 36 and the set of motors 46 and includes a processor 50a, a memory 50b and a communications sub-system 50c both of which are in data communication with processor 50a. Also included in sub-system lob is a user interface 51, which may consist of a keyboard, monitor, floppy disk drive system and other devices to interface a user with processor 50a. Processing system 50 operates to produce a plurality of discrete drops of liquid on surface 42a of substrate 42 by appropriately timing the movement of substrate 42 and egression of liquid 20 or 22 from tip 40.

Figure 2:
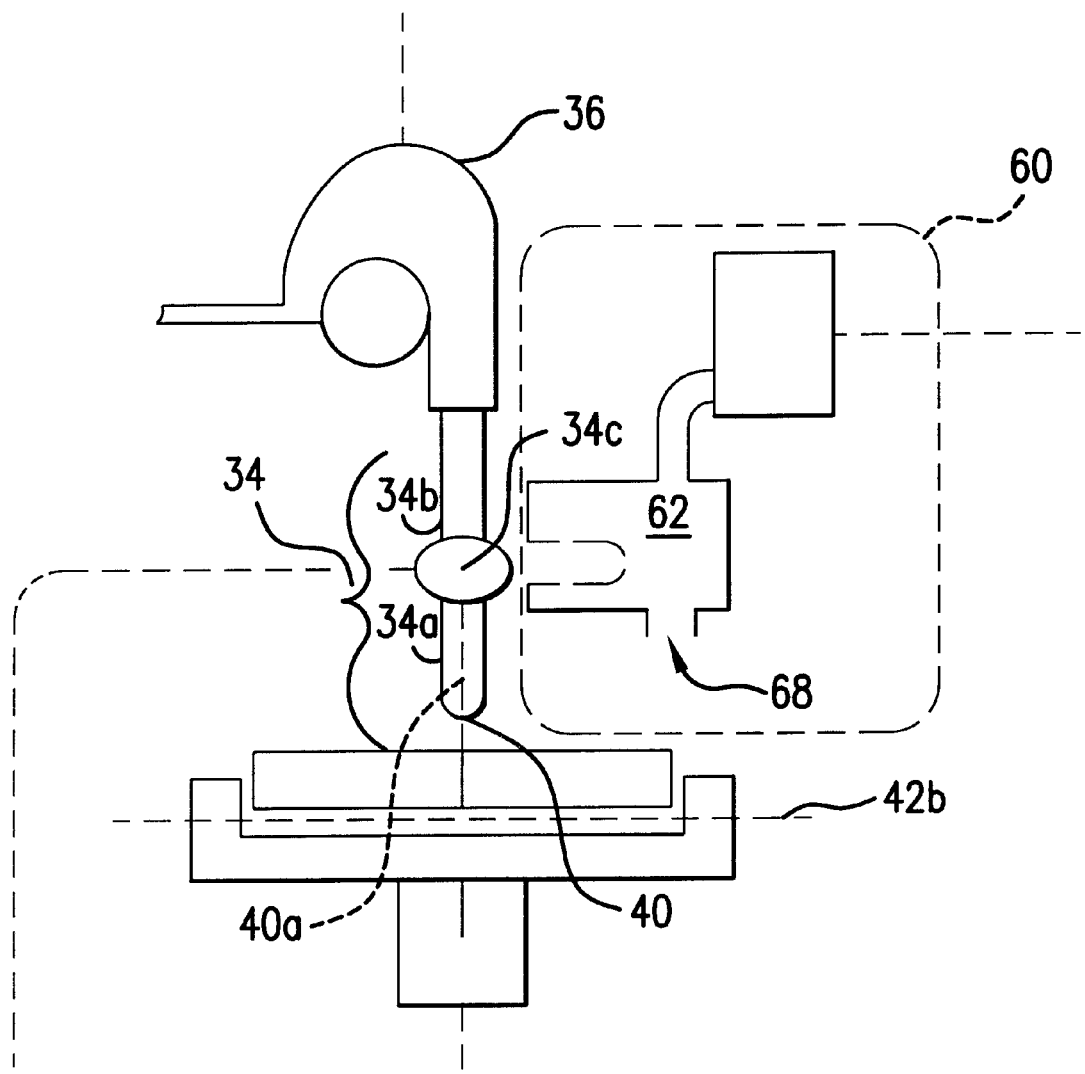
FIG. 2 is a detailed view of the nozzle system and cleaning station shown in FIG. 1, in accordance with one embodiment of the present invention.

Referring to FIGS. 1 and 2, it is desired that continuous delivery of liquid 20 and 22 to nozzle system 34 is effectuated. To that end, system 10 includes a cleaning station 60 having a chamber 62 and a supply of cleaning liquid 64. Supply 64 is in fluid communication with chamber 62 via conduit 66. Chamber 62 may include a waste drain 68 that may be connected to a vacuum source (not shown). Nozzle system 34 is designed to facilitate selectively placing tip 40 in chamber 62 for cleaning. To that end, nozzle system 34 includes a tip portion 34a and a base portion 34b. Base portion 34b is connected to pump 36. Tip portion 34a is pivotally coupled to base portion 34b through a pivot 34c to reciprocate between a dispensing position and a cleaning position. In the cleaning position (shown by dashed lines) dispensing axis 40a is orientated to extend parallel to a plane 42b in which substrate 42 lies. In the dispensing position, dispensing axis 40a extends transversely to plane 42b. In this manner tip 40 may be quickly cleaned during dispensing of liquid 20 or 22.

Alternatively, cleaning station 60 may be designed to move with respect to nozzle system 34, thereby abrogating the need for pivot 34c. In this manner, chamber 62 moves with respect to nozzle system 34 to ensure that tip 40 is disposed therein during cleaning. As such, system 10 may be configured so that mount 44 is moved so that the same is no longer proximate to tip 40 during cleaning. This has the further advantage of reducing particulate contamination of substrate 42. To that end, mount 44 and chamber 62 may be mounted to a moveable table (not shown) to reciprocate in and out of a proximity with tip 40 so that the tip 40 may be selectively placed in cleaning chamber 62. In furtherance of that end, cleaning of tip 40 may be performed during substrate 42 loading to further reduce particulate contamination.

To further facilitate continuous delivery of liquid 20 and 22 to nozzle system 34, system 10 includes two cartridges 16 and 18. Each of cartridges 16 and 18 which has a detector 24 and 26 in optical communication with liquid 20 and 22, contained therein. In this manner, once detector 24 senses that liquid 20 has reached a minimum level in cartridge 16, a signal is transmitted to processor 50a. In response, processor 50a activates valve 28 to disrupt fluid communication between conduits 30 and 32 and effectuate fluid communication between conduits 32 and 38. Thereafter, a user (not shown), such as the owner/lessee of sub-system 10b, would remove cartridge 16 from receptacle 12 and replace the same with a new cartridge. In this manner, pump 36 may maintain a continuous flow of liquid to nozzle system 34, while cartridge 16 is being replaced. A similar situation is present when cartridge 18 is replaced.

However, once detector 24 has sensed that liquid 20 has reached a minimum level, valve 28 cannot be activated to place conduits 30 and 32 in fluid communication until an authorization code has been received. Were both detectors 24 and 26 to sense that liquid level had reached a minimum level then processor 50a would deactivate pump 36, until authorization was received for at least one of the replaced cartridges 16 or 18. Alternatively, pump 36 would be activated by processor 50a only after an authorization code had been received for all of cartridges 16 and 18. This is to prevent, inter alia, cross-contamination of liquids in system 10, because such cross-contamination may produce catastrophic failures in the subsequent patterning of substrate 42.

To avoid cross-contamination, a verification sequence is invoked before dispensing to ensure that the liquid 20 or 22 may be identified and does not differ from liquid that has been previously dispensed by system 10. To that end, each cartridge 16 and 18 includes indicia 56 and 58, respectively, that recites an identification code. The identification code associated with each cartridge 16 and 18 is unique and differs from the identification code associated with the remaining cartridges. The identification code also includes information describing characteristics of liquid 20 or 22, such as the chemical description of the same. As mentioned above, an exemplary use for the present invention is dispensing liquids on substrate 42 in preparation for patterning substrate 42 employing imprint lithography techniques. As a result, exemplary liquids that may be dispensed by system 10 include liquids having one or more of the following ultra violet curable compositions:

Composition 1 n-butyl acrylate+(3-acryloxypropyltristrimethylsiloxy)silane+1,3-bis(3-methacryloxypropyl)tetramethyldisiloxane Composition 2 t-n-butyl acrylate+(3-acryloxypropyltristrimethylsiloxy)silane+Ethylene diol diacrylate Composition 3 t-butyl acrylate+methacryloxypropylpentamethyldisiloxane+1,3-bis(3-methacryloxypropyl)tetramethyldisiloxane The above-identified compositions also include stabilizers that are well known in the chemical art to increase the operational life, as well as initiators. The initiators included in the aforementioned compositions are typically responsive to ultra-violet radiation to cause the compositions to solidify once exposed to ultra violet radiation. As a result, cartridges 16 and 18, as well as conduits 30, 32 and 38 through which liquid 20 and 22 propagate are opaque to ultra-violet radiation. Additionally, system 10 may be enclosed within a housing (not shown) to shield the same from ultra violet radiation.

Referring to FIG. 1, when seeking authorization to dispense liquid, a user operates on processing system 50 to generate a request to processing system 52 over communication link 54. The request includes the identification code recited in the indicia 56 or 58 and information concerning system 10, such as the name of the owner/lessee of system 10, as well as an identification number of system 10. To that end, indicia 56 and 58 may be visually perceivable with an unaided eye so that a user may enter the information contained therein into processing system 50 using user interface 51. Alternatively, indicia 56 and 58 may be machine readable, such as for example, a bar code reader. To that end, a reader 25 may be in data communication with indicia 56 and a reader 27 may be in data communication with indicia 58.

Processing system 52 then receives the request and determines whether authorization should be transmitted to processing system 50 to allow dispensing of liquid 20 or 22. To that end, processing system 52 includes a processor 52a, a memory 52b and a communication sub-system 52c both of which are in data communication with processor 52a. Also included in subsystem 10b is a user interface 53, which may consist of a keyboard, monitor, floppy disk drive system and other devices to interface a user with processor 52a. Memory 52b stores a database containing historical information concerning system 10. The historical information may include the name of the owner/lessee of sub-system 10b, a unique identifier of sub-system 10b, as well as information concerning previous cartridges ordered by the owner/lessee of sub-system 10b, such as the identification codes of the previously ordered cartridges, defining historical identification codes. The historical identification codes include historical data concerning characteristics of liquids contained in the previously ordered cartridges sent to the owner/lessee.

Upon receipt of the request, processor 52a operates on the request and memory 52b to compare the identification code and the system data with the historical information to determine whether to generate a requested authorization code in response. Typically, a requested authorization code is transmitted by processing system 52 to processing system 50 upon finding that the liquid 20 or 22 in cartridges 16 and 18, respectively, matches the liquid ordered by the owner/lessee of subsystem 10b and/or is not incompatible with liquids previously dispensed in sub-system 10b.

Figure 3:
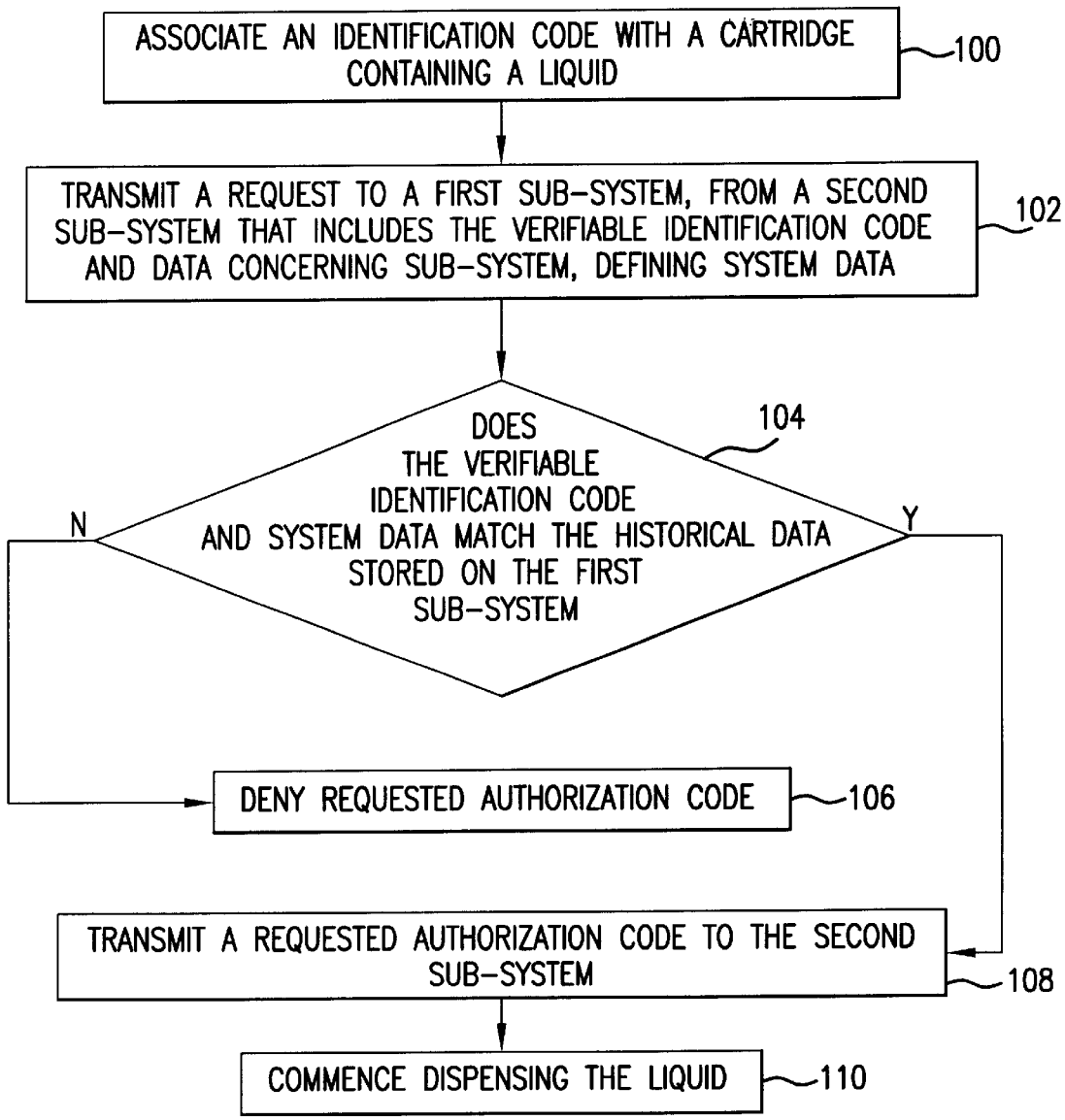
FIG. 3 is a flow diagram of a method for dispensing liquid in accordance with one embodiment of the present invention.

Referring to FIGS. 1 and 3, the operation of system 10 in accordance with one embodiment will be discussed with respect to cartridge 16, but applies equally well to cartridge 18. At step 100 identification code recited in indicia 56 is associated with cartridges, defining a verifiable identification code. The verifiable identification code includes data concerning characteristics of liquid 20, defining verifiable characteristic data. At step 102 a request is received by processing system 52. The request includes the verifiable identification code and data concerning sub-system 10b, defining system data. At step 104, it is determined whether the verifiable identification code and system data matches the historical data. This is achieved by comparing the verifiable identification code and the system data to the database stored in memory 52. The historical information includes a list of identification codes of cartridges sent to the owner/lessee of sub-system 10b. If the verifiable identification code does not match one of the historical identification codes, authorization is denied at step 106. Otherwise, a requested authorization code is transmitted to sub-system 10b at step 108. Were the requested authorization code transmitted to sub-system 10b, dispensing would commence at step 110.

Figure 4:
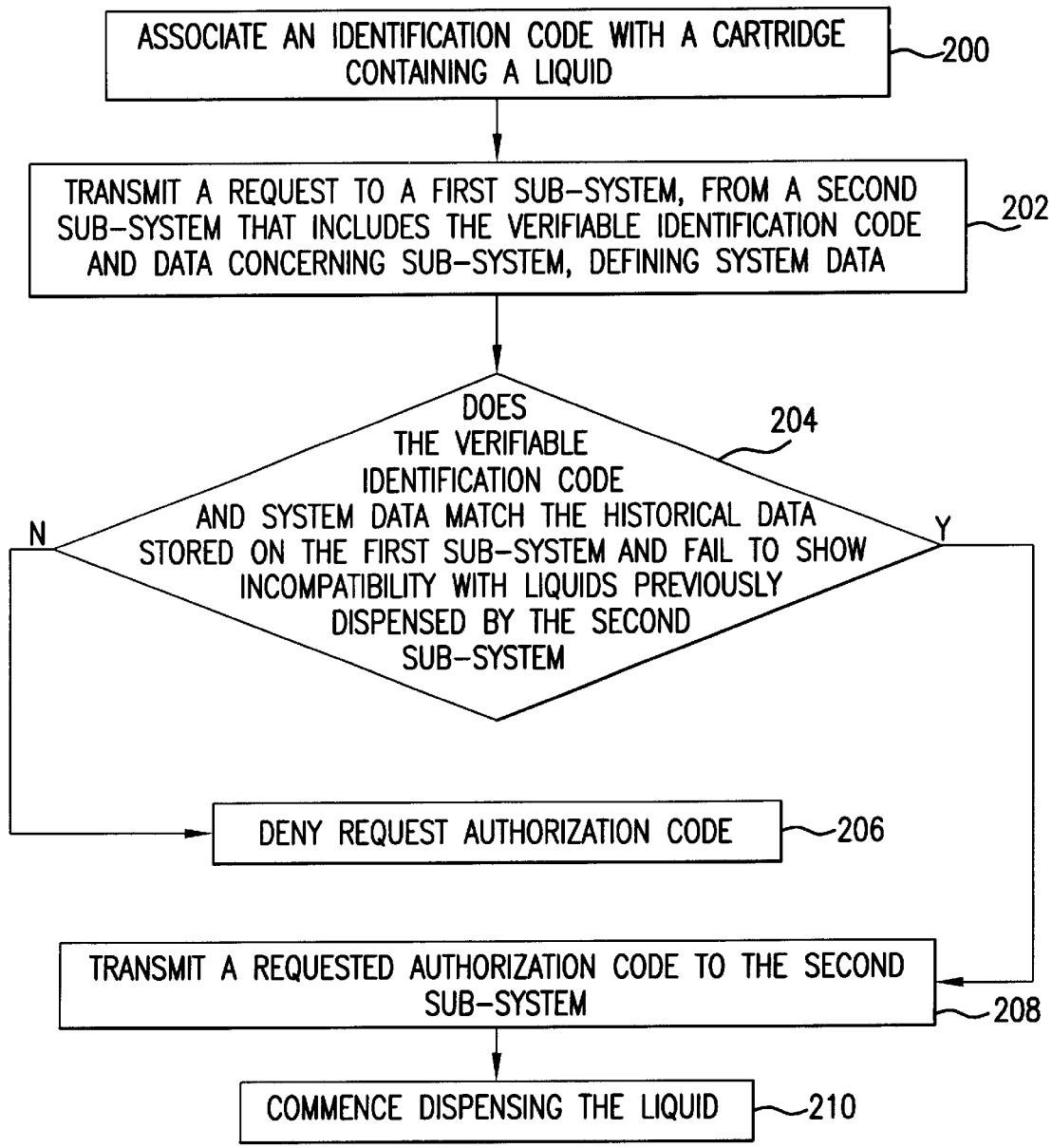
FIG. 4 is a flow diagram of a method for dispensing liquid in accordance with a second embodiment of the present invention.

Referring to FIGS. 1 and 4, operation of system 10 in accordance with an alternate embodiment includes steps 200, 202, 204, 206, 208 and 210. Steps 200, 202, 206, 208 and 210 are identical to steps 100, 102, 106, 108 and 110, mentioned above with respect to FIG. 3. Referring again to FIG. 4, however, at step 204, it is determined whether the verifiable identification code and system data matches the historical data and fails to show any incompatibility with liquids previously dispensed in sub-system 10b. This is achieved by comparing the verifiable identification code and the system data to the database stored in memory 52b. The historical information includes a list of identification codes of cartridges sent to the owner/lessee of sub-system 10b. If the verifiable identification code does not match one of the historical identification codes, or does not indicate compatibility with liquids previously sent to the owner/lessee of sub-system 10b, then a requested authorization code is denied at step 206. Otherwise, a requested authorization code is transmitted to sub-system 10b at step 208. Were the requested authorization code transmitted to sub-system 10b, dispensing would commence at step 210. Sub-system 10b could verify the authenticity of the authorization code transmitted by comparing the same to a copy of the authorization code that is embedded in the program stored in memory 50b.

With the present invention it is possible to verify that the liquid in cartridges 16 and 18 is liquid that is compatible with previous liquid dispensed by sub-system 10b, as well as to ensure that the liquid is from a valid source. To that end, verification of compatibility and validity may be effectuated from an external computer, discussed above with respect to sub-system 10a. Alternatively, verification may be effectuated from an internal computer, such as processing system 50. In this embodiment, a user may enter a security code in user interface 51. To ensure authenticity of cartridges 16 and 18, indicia 56 and 58 may be encoded with a security key.

Figure 5:
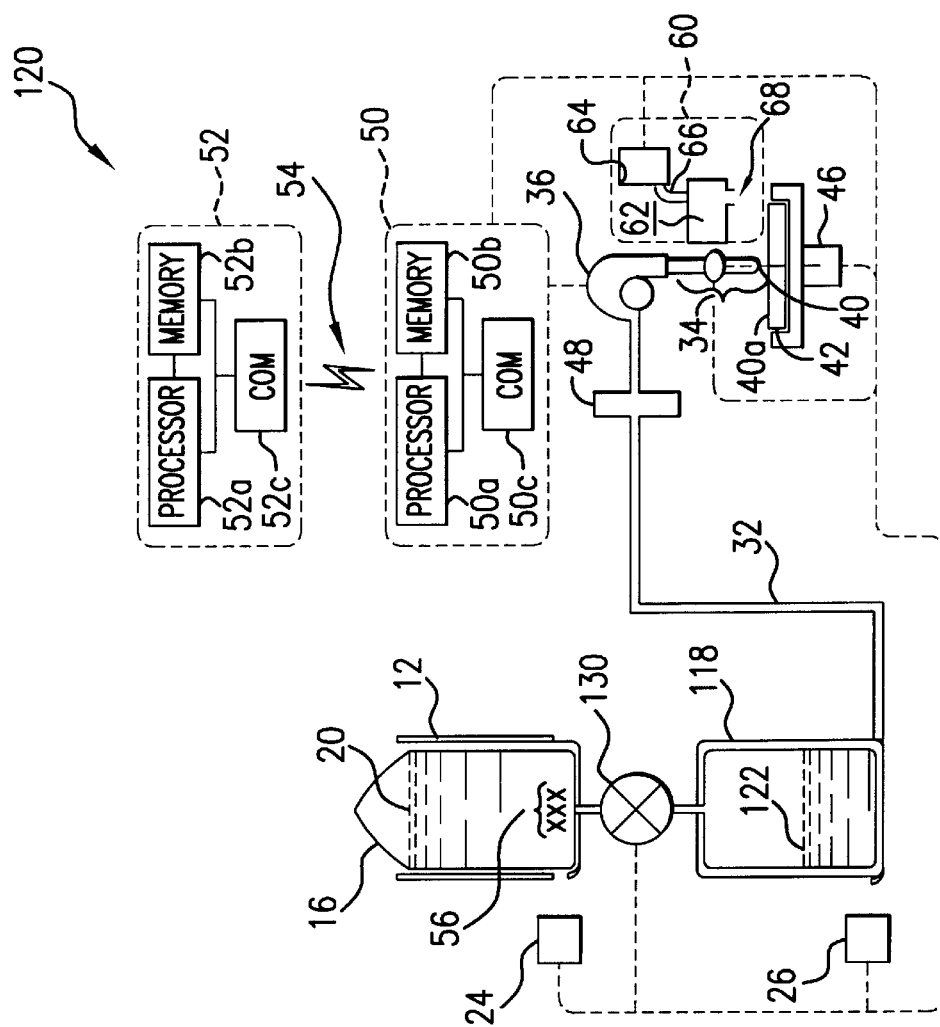
FIG. 5 is a simplified elevation view of a liquid dispensing system in accordance with a second embodiment of the present invention.

Referring to both FIGS. 1 and 5 in another embodiment system 120 omits a second cartridge, such as cartridge 18, as well as receptacle 14. Placed in lieu thereof is a liquid reservoir 118 containing liquid 122. Reservoir 118 may be selectively placed in fluid communication with liquid 20 contained in cartridge 16 with valve 130. Nozzle system 34 is in fluid communication with reservoir 118 via pump 36 and, optionally, filter 48. In this arrangement, detector 26 senses when liquid 122 has reached a minimum level in reservoir 118 and produces a signal in response thereto. Processor 50a senses the signal produced by detector 26 and activated valve 130 to fill reservoir with liquid 20, which typically has the same chemical composition as liquid 122. Once detector 24 senses that liquid 20 has reached minimum level in cartridge 16, a warning may be sent indicating that cartridge 16 must be replaced. Thereafter, a requested authorization code would have to be entered into processing system 50, as described above.

The embodiments of the present invention described above are exemplary. Many changes and modifications may be made to the disclosure recited above, while remaining within the scope of the invention. For example, were two or more incompatible liquids required, an additional sub-system 10*b* could be implemented. Moreover, for each additional liquid employed that was incompatible with existing liquids employed by an owner/lessee, an additional sub-system 10*b* would be present, all of which could communicate with a common sub-system 10*a*. The scope of the invention should, therefore, be determined not with reference to the above description, but instead should be determined with reference to the appended claims along with their full scope of equivalents.

What is claimed is:

1. A method for dispensing a liquid, contained in a cartridge, onto a substrate, employing a dispensing system under control of a processor in data communication with a memory, said method comprising:

associating an identification code with said cartridge, defining a verifiable identification code, said verifiable identification code including data concerning characteristics of said liquid, defining verifiable characteristic data;

receiving, from a user, a request to activate said dispensing system and permit dispensing of said liquid, with said request including said verifiable identification code and data concerning said user, defining user data;

comparing said verifiable identification code and said user data to a database containing historical information concerning said user, with said historical information including identification codes of cartridges previously associated with said user, defining historical identification codes that include historical data concerning characteristics of liquids contained in said cartridges previously associated with said user;

generating a requested authorization code in response to ascertaining that said historical data matches said verifiable characteristic data; and transmitting said requested authorization code to said user to facilitate activation of said dispensing system in furtherance of dispensing said liquid.

2. The method as recited in claim 1 further including storing, in said memory, an embedded authorization code and comparing said embedded authorization code with said requested authorization code and activating said dispensing system in response to ascertaining that said embedded authorization code and said requested authorization code match.

3. The method as recited in claim 1 wherein said verifiable characteristic data includes a chemical description of said liquid.

4. The method as recited in claim 1 further including shielding said liquid from ultra violet radiation.

5. The method as recited in claim 1 wherein said user data and said historical information further includes a personal identification number, with comparing said verifiable identification code further includes comparing said personal identification number in said user data with said personal identification number contained in said historical information, and generating further includes generating said requested authorization code in response to ascertaining that said personal identification number in said user data matches said personal identification number contained in said historical information and said historical data matches said verifiable characteristic data.

6. The method as recited in claim 1 wherein said user data and said historical information further includes information that uniquely identifies said dispensing system, defining a system identifier, with comparing the said verifiable identification code further includes comparing the system identifier included in said user data with the system identifier included in said historical information, and generating further includes generating said requested authorization code in response to ascertaining that said system identifier included in said user data matches said system identifier included in said historical information and said historical data matches said verifiable characteristic data.

7. The method as recited in claim 1 wherein said user data includes an additional identification code associated with an additional cartridge, containing an additional liquid, coupled to said dispensing system, with said additional identification code including data concerning additional characteristics associated with said additional liquid, with comparing said verifiable identification code further including comparing said additional identification code with said verifiable identification code and generating further includes generating said requested authorization code in response to ascertaining that said historical data matches said verifiable characteristic data and said additional characteristics.

8. The method as recited in claim 1 wherein transmitting said requested authorization code to said user further includes producing an audible signal to said user that includes said requested authorization code.

9. The method as recited in claim 1 wherein transmitting said requested authorization code to said user further includes propagating computer readable information of a wide area network to said processor that includes said requested authorization code.

10. The method as recited in claim 1 further including providing a substrate, lying in a plane, and said dispensing system with a nozzle system that defines a dispensing axis along which said liquid propagates, and selectively moving said nozzle system between a dispensing position and a cleaning position, with said dispensing axis extending transversely to said plane with said nozzle system being in said dispensing position and said dispensing axis extending parallel to said plane when said nozzle system is in said cleaning position.

11. The method as recited in claim 1 further includes providing a substrate, providing said dispensing system with a nozzle and providing a cleaning system having a cleaning chamber, with said cleaning system and said substrate connected to move in and out of proximity to said nozzle to selectively place said nozzle in said cleaning chamber.

12. A method for dispensing a liquid, contained in a cartridge, onto a substrate, employing a dispensing system under control of a processor in data communication with a memory, said method comprising:

associating an identification code with said cartridge, defining a verifiable identification code, said verifiable identification code including data concerning characteristics of said liquid, defining verifiable characteristic data, said verifiable characteristic data including a chemical description of said liquid;

storing, in said memory, an embedded authorization code;

receiving, from a user, a request to activate said dispensing system and permit dispensing of said liquid, with said request including said verifiable identification code and data concerning said user, defining user data;

comparing said verifiable identification code and said user data to a database containing historical information concerning said user, with said historical information including identification codes of cartridges previously associated with said user, defining historical identification codes that include historical data concerning characteristics of liquids contained in said cartridges previously associated with said user;

generating a requested authorization code in response to ascertaining that said historical data matches said verifiable characteristic data;

transmitting said requested authorization code to said user to facilitate activation of said dispensing system in furtherance of dispensing said liquid; and comparing said embedded authorization code with said requested authorization code and activating said dispensing system in response to ascertaining that said embedded authorization code and said requested authorization code match.

13. The method as recited in claim 12 wherein said user data and said historical information further includes a personal identification number, with comparing said verifiable identification code further includes comparing said personal identification number in said user data with said personal identification number contained in said historical information, and generating further includes generating said requested authorization code in response to ascertaining that said personal identification number in said user data matches said personal identification number contained in said historical information and said historical data matches said verifiable characteristic data.

14. The method as recited in claim 12 wherein said user data and said historical information further includes information that uniquely identifies said dispensing system, defining a system identifier, with comparing the said verifiable identification code further includes comparing the system identifier included in said user data with the system identifier included in said historical information, and generating further includes generating said requested authorization code in response to ascertaining that said system identifier included in said user data matches said system identifier included in said historical information and said historical data matches said verifiable characteristic data.

15. The method as recited in claim 12 wherein said user data includes an additional identification code associated with an additional cartridge, containing an additional liquid, coupled to said dispensing system, with said additional identification code including data concerning additional characteristics associated with said additional liquid, with comparing said verifiable identification code further including comparing said additional identification code with verifiable identification code and generating further includes generating said requested authorization code in response to ascertaining that said historical data matches said verifiable characteristic data and said additional characteristics.

16. The method as recited in claim 12 wherein transmitting said requested authorization code to said user further includes producing an audible signal to said user that includes said requested authorization code.

17. The method as recited in claim 12 wherein transmitting said requested authorization code to said user further includes propagating computer readable information of a wide area network to said processor that includes said requested authorization code.

18. The method as recited in claim 12 further including providing a substrate, lying in a plane, and said dispensing system with a nozzle system that defines a dispensing axis along which said liquid propagates, and selectively moving said nozzle system between a dispensing position and a cleaning position, with said dispensing axis extending transversely to said plane with said nozzle system being in said dispensing position and said dispensing axis extending parallel to said plane when said nozzle system is in said cleaning position.

19. The method as recited in claim 12 further includes providing a substrate, providing said dispensing system with a nozzle and providing a cleaning system having a cleaning chamber, with said cleaning system and said substrate connected to move in and out of proximity to said nozzle to selectively place said nozzle in said cleaning chamber.

20. The method as recited in claim 12 further including shielding said liquid from ultra violet radiation.

\* \* \* \* \*